(12) United States Patent
Amano

(10) Patent No.: US 8,136,538 B2
(45) Date of Patent: Mar. 20, 2012

(54) PROCESSING SYSTEM, PROCESSING METHOD, AND STORAGE MEDIUM

(75) Inventor: Yoshifumi Amano, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 529 days.

(21) Appl. No.: 12/308,372

(22) PCT Filed: Nov. 12, 2007

(86) PCT No.: PCT/JP2007/071935
§ 371 (c)(1),
(2), (4) Date: Dec. 12, 2008

(87) PCT Pub. No.: WO2008/059799
PCT Pub. Date: May 22, 2008

(65) Prior Publication Data
US 2010/0154836 A1    Jun. 24, 2010

(30) Foreign Application Priority Data

Nov. 15, 2006  (JP) .................... 2006-309210

(51) Int. Cl.
*B08B 7/00* (2006.01)
*B08B 7/04* (2006.01)
(52) U.S. Cl. .............. 134/97.1; 134/96.1; 134/98.1; 134/105; 134/902
(58) Field of Classification Search .......... 134/105, 134/182, 60, 58 R, 56 R, 96.1, 97.1, 98.1, 134/902
See application file for complete search history.

(56) References Cited

U.S. PATENT DOCUMENTS
| | | | | |
|---|---|---|---|---|
| 4,795,497 A | * | 1/1989 | McConnell et al. | 134/18 |
| 4,917,123 A | * | 4/1990 | McConnell et al. | 134/95.2 |
| 5,950,646 A | * | 9/1999 | Horie et al. | 134/105 |
| 6,248,168 B1 | * | 6/2001 | Takeshita et al. | 118/52 |

FOREIGN PATENT DOCUMENTS
| | | |
|---|---|---|
| JP | 6-97146 | 4/1994 |
| JP | 2002-110605 | 4/2002 |
| JP | 2003-224102 | 8/2003 |
| JP | 2003-332322 | 11/2003 |

OTHER PUBLICATIONS

Translation of JP 06-097146.*
PCT Notification of Transmittal of Translation of the International Preliminary Examination Report (Form PCT/IB/338) dated Jan. 2004.
PCT International Preliminary Report on Patentability (Form PCT/IB/373) dated Jan. 2004.
PCT Written Opinion of the International Searching Authority (Form/ISA/237) dated Apr. 2005.
Korean Office Action issued on Jun. 24, 2010 for Application No. 10-2008-7016691 w/ English language translation.

* cited by examiner

*Primary Examiner* — Alexander Markoff
(74) *Attorney, Agent, or Firm* — Smith, Gambrell & Russell; LLP

(57) ABSTRACT

A processing system 1 comprises: a processing vessel 30 configured to accommodate an object to be processed W in a processing space 83; a process-fluid generating part 41 configured to generate a process fluid of a predetermined temperature; and a main duct 56 arranged between the process-fluid generating part 41 and the processing vessel 30, the main duct 56 being configured to guide the process fluid supplied from the process-fluid generating part 41. A process-fluid supply duct 171 is arranged on a downstream side of the main duct 56 via a switching valve 70, the process-fluid supply duct 171 being configured to introduce the process fluid into the processing space 83 of the processing vessel 30. A process-fluid bypass duct 172 is arranged on the downstream side of the main duct 56 via the switching valve 70, the process-fluid bypass duct 172 being configured to guide a process fluid, which is not introduced to the process-fluid supply duct 171, so as to bypass the processing space 83. The main duct 56 is provided with a flow-rate adjusting mechanism 65 for adjusting a flow rate of the process fluid flowing through the main duct 56.

6 Claims, 5 Drawing Sheets

PROCESSING SYSTEM, PROCESSING METHOD, AND STORAGE MEDIUM

CROSS REFERENCE TO RELATED APPLICATIONS

This application is based upon and claims the benefit of priority from the prior Japanese Patent Application No. 2006-309210 filed on Nov. 15, 2006, the entire contents of which are incorporated herein by reference.

FIELD OF THE INVENTION

The present invention relates to a processing system and a processing method for processing an object to be processed such as a semiconductor wafer and a glass for an LCD substrate, and further relates to a storage medium storing a computer program to perform the processing method.

BACKGROUND ART

In a manufacturing step of a semiconductor device, for example, as a step for peeling a resist applied on a surface of a semiconductor wafer (hereinafter referred to as "wafer"), there is known a step in which a mixed gas of an ozone gas and a vapor is supplied to a wafer accommodated in a processing vessel so that the resist is oxidized and water-solubilized by the mixed gas, and the resist is removed by a deionized water. A processing system adapted to perform such a step for processing an object to be processed includes an ozone-gas generating part for generating an ozone gas, and a vapor generating part for generating a vapor. An ozone gas and a vapor, which have been generated by the ozone-gas generating part and the vapor generating part, are mixed and then supplied into a processing vessel (for example, Patent Document 1).
Patent Document 1: JP2003-332322A

DISCLOSURE OF THE INVENTION

In the above processing system, when process gases such as an ozone gas and a vapor are supplied into the processing vessel, it is important to maintain constant amounts of the gases to be supplied, in order to suitably perform the process for water-solubilizing a resist, which is performed in the processing vessel. To this end, it is considered that flow-rate adjusting mechanisms such as an orifice and a needle valve are disposed in ducts that supply process gases such as an ozone gas and a vapor to the processing vessel, so as to adjust amounts of process gas to be supplied by means of the flow-rate adjusting mechanisms.

The vapor generating part generates a vapor by heating and boiling a deionized water which has been supplied from outside, for example. The vapor of a high temperature, which has been generated by the vapor generating part, is supplied into the processing vessel, with its temperature being retained. Thus, particularly in a flow-rate adjusting mechanism through which a vapor passes, when a process gas is supplied to the processing vessel, the flow-rate adjusting mechanism is heated to a high temperature by the heat of the vapor. As a result, there is a possibility that the flow-rate adjusting mechanism is expanded by the heat to increase a supply amount.

On the other hand, in the above processing system, when a wafer is loaded into the processing vessel, and when a processed wafer is unloaded from the processing vessel, the supply of a process gas into the processing vessel is temporarily stopped. Then, under the condition that the supply of the process gas is temporarily stopped, the processing vessel is opened, and a wafer is loaded or unloaded by means of a suitable transfer apparatus.

However, during the loading or the unloading operation of a wafer into or from the processing vessel, since the supply of the process gas is stopped, there may be arise a problem in that the temperature of the flow-rate adjusting mechanism is varied. For example, in the aforementioned flow-rate adjusting mechanism through which a vapor passes, when a process gas is supplied to the processing vessel, the flow-rate adjusting mechanism is heated to a high temperature by the heat of the vapor. However, while the supply of the process gas is being stopped, the flow-rate adjusting mechanism is cooled.

Thus, when a process is restarted after a wafer has been loaded into the processing vessel, an amount of a process gas to be supplied is adjusted, with the temperature of the flow-rate adjusting mechanism having been lowered. In this case, immediately after the process is restarted, in particular, the temperature of the flow-rate adjusting mechanism is unstable and thus the process-gas supply amount cannot be adjusted with a high precision.

Therefore, the object of the present invention is to supply a process fluid such as a vapor to be supplied into a processing vessel at a constantly stable flow rate.

In order to achieve the above object, a processing system according to the present invention comprises: a processing vessel configured to accommodate an object to be processed in a processing space; a process-fluid generating part configured to generate a process fluid of a predetermined temperature; a main duct connected to the process-fluid generating part, the main duct being configured to guide the process fluid supplied from the process-fluid generating part; a process-fluid supply duct arranged on a downstream side of the main duct via a switching valve, the process-fluid supply duct being configured to introduce the process fluid into the processing vessel so as to supply the process fluid to the processing space in the processing vessel; and a process-fluid bypass duct arranged on the downstream side of the main duct via the switching valve, the process-fluid bypass duct being configured to guide a process fluid, which is not introduced to the process-fluid supply duct, so as to bypass the processing space; wherein the main duct is provided with a flow-rate adjusting mechanism for adjusting a flow rate of the process fluid flowing through the main duct.

Since the main duct to which a process fluid is supplied from the process-fluid generating part is provided with the flow-rate adjusting mechanism, the process fluid is constantly supplied to the flow-rate adjusting mechanism. Thus, a temperature of the flow-rate adjusting mechanism is made constant all the time. Accordingly, a precise flow-rate adjustment can be achieved.

It is preferable that the processing system of the present invention further comprises: a discharge duct configured to discharge the process fluid discharged from the processing space in the processing vessel, and the process fluid introduced by the process-fluid bypass duct to bypass the processing space and to pass through the processing vessel; wherein the discharge duct is provided with a flow-rate adjusting mechanism for adjusting a flow rate of the process fluid flowing through the discharge duct.

Due to the provision of the flow-rate adjusting mechanisms both in the main duct and the discharge duct, a more precise flow-rate adjustment can be achieved.

In the processing system of the present invention, it is preferable that the process-fluid bypass duct is provided with a temperature adjusting duct for adjusting a temperature of the process fluid flowing through the process-fluid bypass duct.

Due to this structure, the temperature of the process fluid can be suitably adjusted also in the process-fluid bypass duct. Thus, there can be prevented a condensation of the process fluid in the discharge duct or the like on the downstream side.

In the processing system of the present invention, it is preferable that the temperature adjusting duct is thermally in contact with the processing vessel.

Due to this structure, it is possible to adjust the temperature of the process fluid by using a heat of the processing vessel.

In the processing system of the present invention, it is preferable that the process fluid is a vapor.

In the processing system of the present invention, it is preferable that the process-fluid bypass duct is configured to guide a process fluid, which is not introduced to the process-fluid supply duct, so as to bypass the processing space but to pass through the processing vessel.

A processing method according to the present invention is a processing method for processing an object to be processed by supplying a process fluid of a predetermined temperature to a processing space in a processing vessel, wherein there are optionally selected: a condition in which the process fluid of a predetermined temperature is supplied to the processing space in the processing vessel, with a flow rate of the process fluid being adjusted; and a condition in which the process fluid of a predetermined temperature is guided to bypass the processing space in the processing vessel, with a flow rate of the process fluid being adjusted.

In the processing method of the present invention, it is preferable that a process fluid that has been discharged from the processing space in the processing vessel, and a process fluid that has been guided to bypass the processing space in the processing vessel, are discharged through a common flow-rate adjusting mechanism.

In the processing method of the present invention, it is preferable that the process fluid guided to bypass the processing space in the processing vessel is discharged through the common flow-rate adjusting mechanism, after a temperature of the process fluid has been adjusted.

In the processing method of the present invention, it is preferable that the process fluid is a vapor.

In the processing method of the present invention, it is preferable that when the process fluid is guided to bypass the processing space in the processing vessel, the process fluid is guided to bypass the processing space but to pass through the processing vessel.

A storage medium according to the present invention is a storage medium storing a computer program executable by a computer to perform a processing method, wherein the processing method is a processing method for processing an object to be processed by supplying a process fluid of a predetermined temperature to a processing space in a processing vessel, wherein there are optionally selected: a condition in which the process fluid of a predetermined temperature is supplied to the processing space in the processing vessel, with a flow rate of the process fluid being adjusted; and a condition in which the process fluid of a predetermined temperature is guided to bypass the processing space in the processing vessel, with a flow rate of the process fluid being adjusted.

According to the present invention, both in a case in which the process fluid is supplied into the processing vessel, and in a case in which the process fluid is caused to bypass the processing vessel so as to be discharged, a process fluid is constantly supplied to the flow-rate adjusting mechanisms.

Thus, temperatures of the flow-rate adjusting mechanisms are made constant all the time. Accordingly, a precise flow-rate adjustment can be achieved.

MODE FOR CARRYING OUT THE INVENTION

Figure 1:
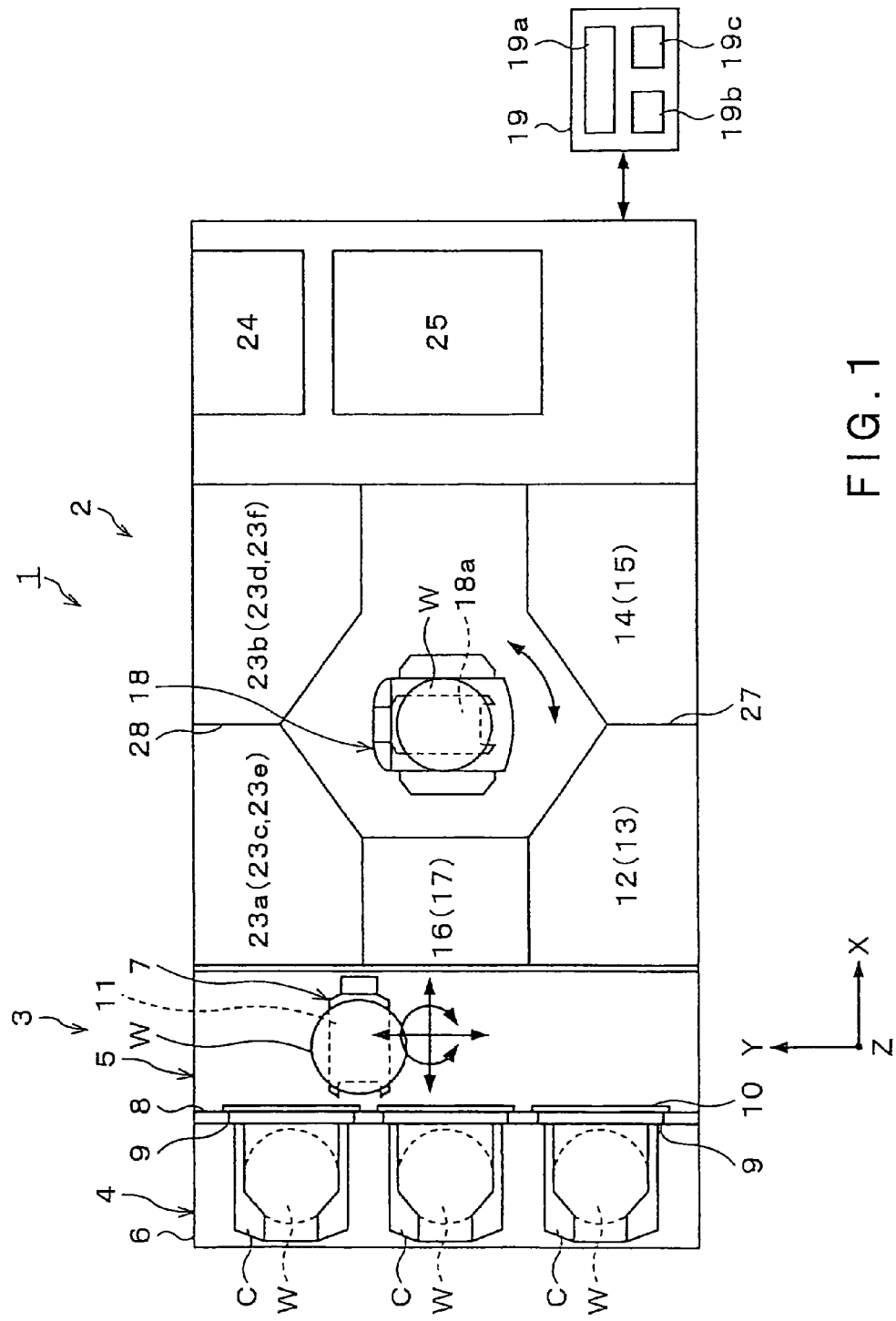
FIG. 1 is a plan view of a processing system in an embodiment of the present invention.
Figure 2:
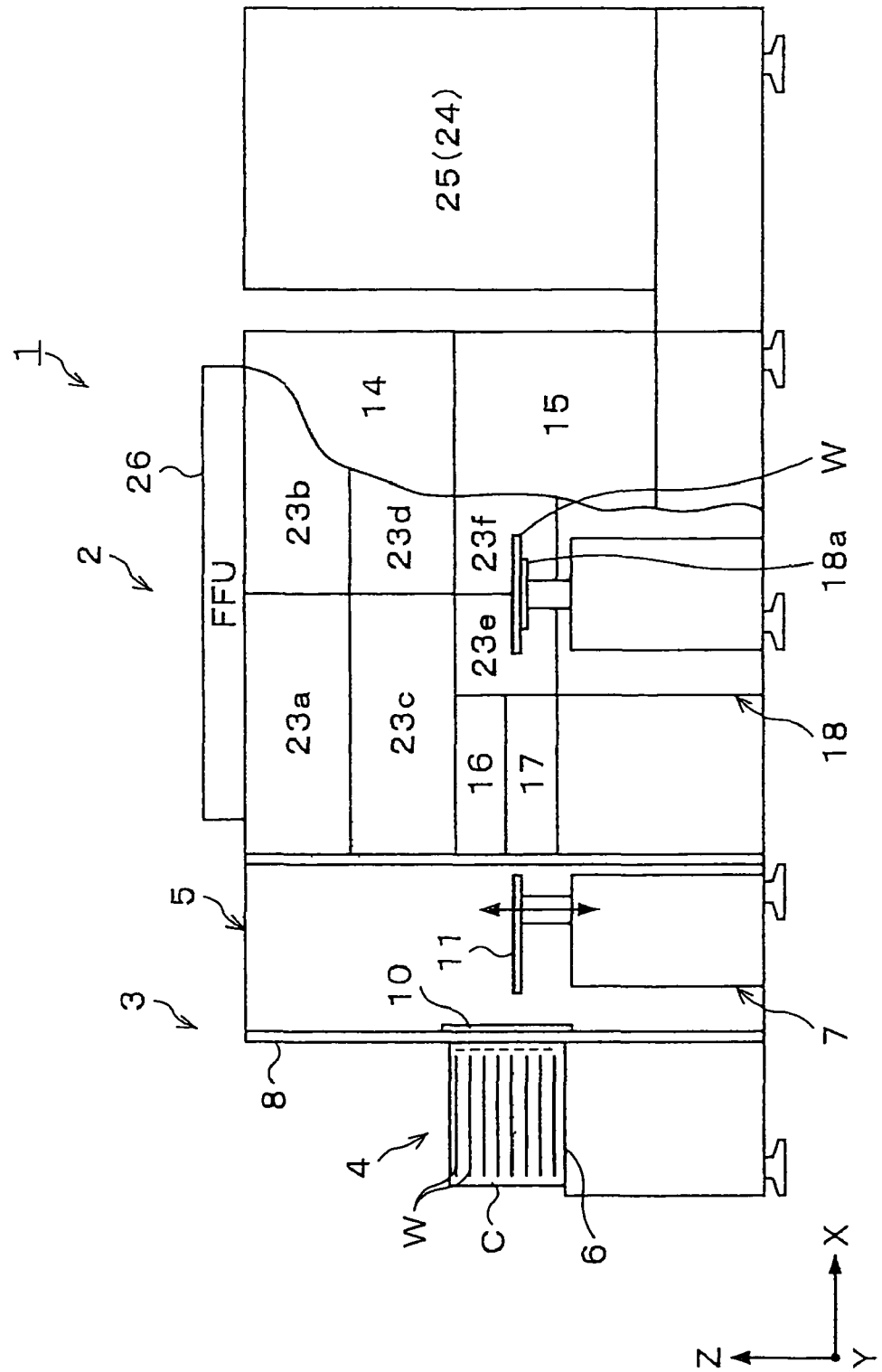
FIG. 2 is a side view of the processing system in the embodiment of the present invention.

An embodiment of the present invention is described herebelow based on a processing system 1 that performs a process to a wafer, which is an example of an object to be processed, by water-solubilizing a resist applied on a surface of the wafer so as to peel the resist. FIG. 1 is a plan vie of the processing system 1 in this embodiment. FIG. 2 is a side view thereof. In this specification and the drawings, structural elements having substantially the same function are shown by the same reference numbers, and a detailed description thereof is omitted.

The processing system 1 includes a processing part 2 configured to perform a process for water-solubilizing a resist and a cleaning process to a wafer W, and a loading/unloading part 3 configured to load and unload a wafer W to and from the processing part 2. The processing system 1 further includes a control computer 19 configured to give control commands to respective parts of the processing system 1. For convenience of explanation, in a horizontal plane of FIGS. 1 and 2, a width direction of each processing part 2 and the loading/unloading part 3 is defined as a Y direction, a direction in which the processing part 2 and the loading/unloading part 3 are aligned (a direction perpendicular to the Y direction) is defined as an X direction, and a vertical direction is defined as a Z direction.

The loading/unloading part 3 is composed of an in/out port 4 and a wafer transfer part 5. The in/out port 4 is provided with a stage 6 for placing thereon a vessel (carrier C) capable of accommodating a plurality, e.g., twenty five wafers W of a substantially discoid shape, with predetermined intervals therebetween in a substantially horizontal direction. The wafer transfer part 5 is provided with a transfer apparatus 7 that conveys a wafer W between the carrier C placed on the stage 6 and the processing part 2.

A wafer W is loaded and unloaded through one side surface of the carrier C, and a lid member capable of being opened and closed is disposed on the side surface of the carrier C. A shelf plate, which can hold wafers W with predetermined intervals therebetween, is disposed on an inner wall, and 25 slots for accommodating wafers W are formed. Wafers W are accommodated one by one in each slot, with a front surface (a surface in which a semiconductor device is formed) of each wafer W being an upper surface (a surface facing upward when a wafer W is horizontally held).

A plurality of, e.g., three carriers can be placed on the stage 6 of the in/out port 4 such that the carriers are aligned on predetermined positions in the Y direction. The carrier C is placed, with the side surface equipped with the lid member facing a boundary wall 8 between the in/out port 4 and the wafer transfer part 5. A window 9 is formed in the boundary wall 8 at a position corresponding to the position on which the carrier C is placed. On a side of the wafer transfer part 5 of the window 9, there is disposed a window opening/closing mechanism 10 that opens and closes the window 9 by a shutter or the like.

The window opening/closing mechanism 10 can also open and close the lid member disposed on the carrier C, and can open and close the window 9 simultaneously with the opening and closing of the lid member of the carrier C. When the window 9 is opened to communicate a wafer loading/unloading opening of the carrier C with the wafer transfer part 5, the wafer transfer apparatus 7 disposed on the wafer transfer part 5 can access the carrier C, whereby a wafer W can be transferred.

The wafer transfer apparatus 7 located in the wafer transfer part 5 is configured to be movable in the Y and Z directions, and rotatable about the Z direction as a central axis. The wafer transfer apparatus 7 has a drawing and receiving arm 11 that holds a wafer W. The drawing and receiving arm 11 is slidable in the X direction. Thus, the wafer transfer apparatus 7 is configured to access any of the slots on a given height position of all the carriers C placed on the stage 6, and to access upper and lower wafer delivery units 16 and 17 arranged in the processing part 2, so as to transfer a wafer W from the in/out port 4 to the processing part 2, and to transfer a wafer W from the processing part 2 to the in/out port 4.

The processing part 2 has: a main wafer transfer apparatus 18 as a transfer means; the two wafer delivery units 16 and 17 on which a wafer W is temporarily placed for conveying the wafer W between the processing part 2 and the wafer transfer part 5; four cleaning units 12, 13, 14, and 15; and six processing units 23*a* to 23*f* for performing a process for water-solubilizing a resist.

In the processing part 2, there are provided a process-gas generating unit 24, and a chemical-liquid storage unit 25. The process-gas generating unit 24 is equipped with an ozone-gas generating part 40 that generates an ozone gas as a process fluid to be supplied to the processing units 23*a* to 23*f*, and a vapor generating part 41 that generates a vapor. The chemical-liquid storage unit 25 stores a predetermined process liquid to be supplied to the cleaning units 12, 13, 14, and 15. Disposed on a ceiling portion of the processing part 2 is a fan filter unit (FFU) 26 that supplies a downflow of a clean air to the respective units and the main wafer transfer apparatus 18.

A part of the downflow from the fan filter unit (FFU) 26 is configured to outflow toward the wafer transfer part 5 through the wafer delivery units 16 and 17 and an upper space thereof. Thus, invasion of particles from the wafer transfer part 5 to the processing part 2 can be prevented, and a cleanliness of the processing part 2 can be maintained.

Each of the wafer delivery units 16 and 17 is a unit on which a wafer W is temporarily placed between the processing part 2 and the wafer transfer part 5. The wafer delivery units 16 and 17 are stacked with each other in an up and down direction. In this case, the lower wafer delivery unit 17 can be used for placing thereon a wafer W when the wafer W is transferred from the in/out port 4 to the processing part 2, while the upper wafer delivery unit 16 can be used for placing thereon a wafer W when the wafer W is transferred from the processing part 2 to the in/out port 4.

The main wafer transfer apparatus 18 is configured to be movable in the X and Z directions, and rotatable about the Z direction as a central axis. The main wafer transfer apparatus 18 has a transfer arm 18*a* that transfers a wafer W. The transfer arm 18*a* is slidable in the Y direction. Thus, the main wafer transfer apparatus 18 is capable of accessing all the wafer delivery units 16 and 17, the cleaning units 12 to 15, and the processing units 23*a* to 23*f*.

The respective cleaning units 12, 13, 14, and 15 perform a cleaning process and a drying process to wafers W which have been subjected to a process for water-solubilizing a resist in the processing units 23*a* to 23*f*. The cleaning units 12, 13, 14, and 15 are arranged in two columns and two rows. As shown in FIG. 1, the cleaning units 12 and 13 and the cleaning units 14 and 15 have the symmetrical structures with respect to a wall surface 27 as a boundary therebetween. Excluding the symmetric structure, the respective cleaning units 12, 13, 14, and 15 are of substantially the same structure.

On the other hand, the respective processing units 23*a* to 23*f* perform a process for water-solubilizing a resist applied on a surface of a wafer W. As shown in FIG. 2, the processing units 23*a* to 23*f* are arranged in two columns and three rows. In the left column, the processing units 23*a*, 23*c*, and 23*e* are arranged in this order from above. In the right column, the processing units 23*b*, 23*d*, and 23*f* are arranged in this order from above. As shown in FIG. 1, the processing unit 23*a* and the processing unit 23*b*, the processing unit 23*c* and the processing unit 23*d*, and the processing unit 23*e* and the processing unit 23*f* have the symmetrical structures with respect to a wall surface 28 as a boundary therebetween. Excluding the symmetric structure, the respective processing units 23*a* to 23*f* are of substantially the same structure.

Pipes configured to supply an ozone gas and a vapor as process fluids to the processing units 23*a* to 23*f* are of the same structure. Thus, taking the processing unit 23*a* as an example, the pipe and its structure are described in detail.

Figure 3:
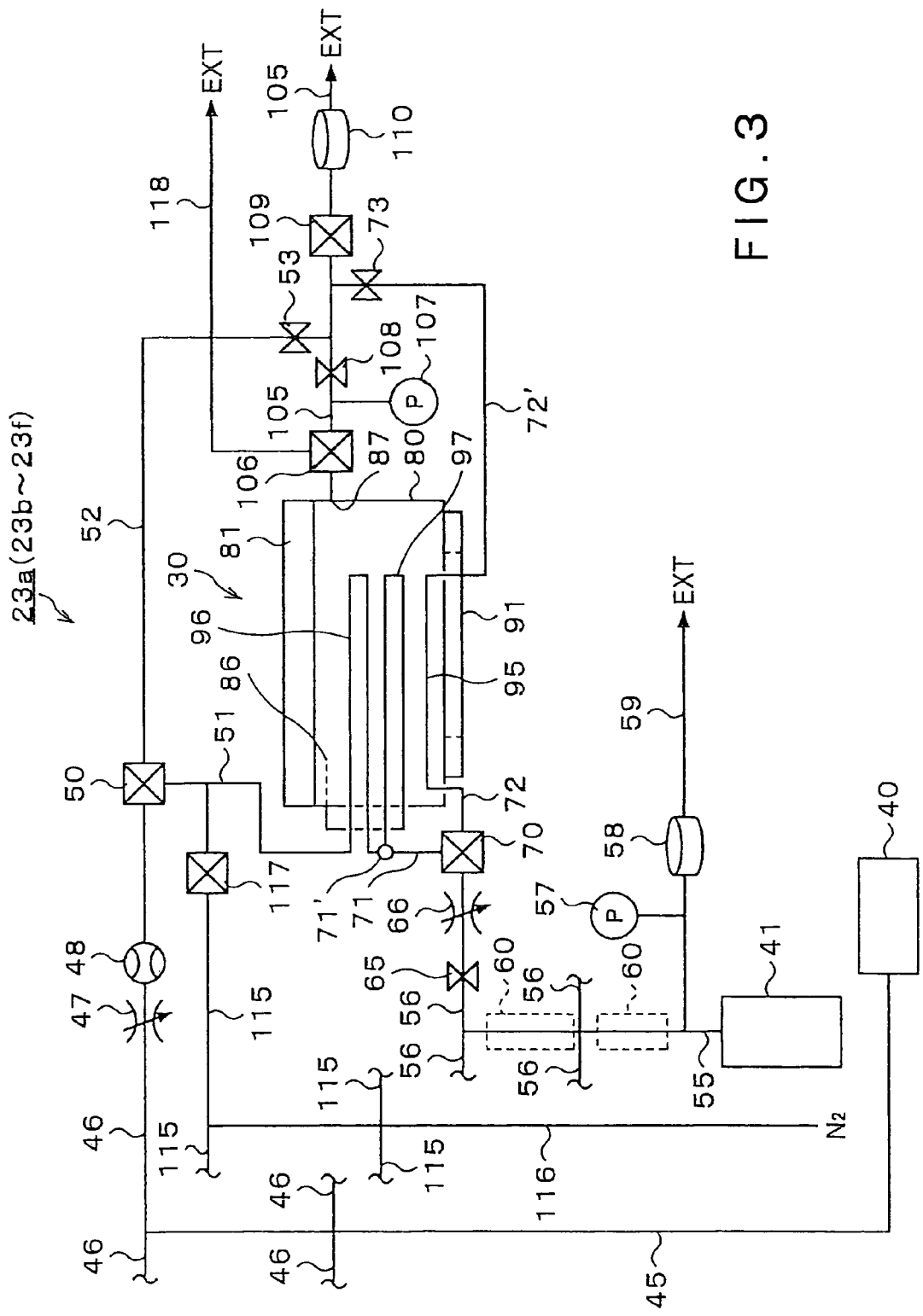
FIG. 3 is a schematic structural view of a processing unit.

FIG. 3 is a schematic structural view of the processing unit 23*a*. The processing unit 23*a* has a processing vessel 30 that can accommodate a wafer W. An ozone gas and a vapor as process fluids can be supplied to the processing vessel 30 from the ozone-gas generating part 40 and the vapor generating part 41 located in the aforementioned process-gas generating unit 24.

The ozone gas supplying part 40 can generate an ozone gas by discharging electricity in a gas containing an oxygen. The ozone-gas generating part 40 is common to the respective processing units 23*a* to 23*f* provided in the processing system 1. Connected to an initial ozone duct 45 that is directly connected to the ozone-gas generating part 40 is a main ozone duct 46 which is branched from the initial ozone duct 45 to correspond to the respective processing units 23*a* to 23*f*. The main ozone duct 46 is provided with a needle valve 47 and a flowmeter 48. Thus, an ozone gas, which has been generated by the ozone-gas generating part 40, can be supplied to the processing vessel 30 of the processing unit 23*a* at a desired flow rate.

A downstream side of the main ozone duct 46 is connected, via a switching valve 50, to a process-side ozone-gas duct 51 that supplies an ozone gas to the processing vessel 30, and to a bypass-side ozone-gas duct 52 that causes an ozone gas to bypass the processing vessel 30. The switching valve 50 is a three-way valve, and thus can select a condition in which an ozone gas generated by the ozone-gas generating part 40 is supplied to the processing vessel 30 of the processing unit 23*a* through the process-side ozone-gas duct 51, and a condition in which an ozone gas generated by the ozone-gas generating part 40 is passed through the bypass-side ozone-gas duct 52 without being supplied to the processing vessel 30. A downstream side of the bypass-side ozone-gas duct 52 is connected to a main discharge duct 105 described below via a flowback preventing orifice 53 for preventing a flowback of the ozone gas.

The vapor generating part 41 can generate a vapor by boiling a deionized water that has been supplied from outside. The vapor generating part 41 is common to the respective processing units 23a to 23f provided in the processing system 1. Connected to an initial vapor duct 55 that is directly connected to the vapor generating part 41 is a main vapor duct 56 which is branched from the initial vapor duct 55 to correspond to the respective processing units 23a to 23f.

Connected to the initial vapor duct 55 is an escape duct 59 provided with a pressure switch 57 and a relief valve 58. Thus, when a pressure in the vapor generating part 41 exceeds a set pressure value, a part of the vapor can be discharged outside through the escape duct 59. Accordingly, an inside of the initial vapor duct 55 can be maintained at a constant vapor pressure all the time. In addition, a pipe heat-retaining heater 60 is mounted on the initial vapor duct 55, so that the initial vapor duct 55 can be retained at temperatures of 110° C. to 120° C., for example. Thus, lowering of a temperature of the vapor in the original vapor duct 55 can be prevented.

The main vapor duct 56 branched from the initial vapor duct 55 is provided with an orifice 65 and a needle valve 66. The orifice 65 and the needle valve 66 serve as a flow-rate adjusting mechanism due to which a vapor generated in the vapor generating part 41 can be supplied to the processing vessel 30 of the processing unit 23a at a desired flow rate.

The reason for providing both the orifice 65 and the needle valve 66, which serve as a flow-rate adjusting mechanism, in the main vapor duct 56 is as follows. Namely, as described above, since the vapor generating part 41 generates a vapor by boiling a deionized water, the inside of the main vapor duct 55 always undergoes a high constant pressure condition. Under such a high pressure condition, it is difficult to precisely adjust a flow rate by the multi-purpose needle valve 66. Thus, by providing the orifice 65, a pressure in the main vapor duct 56 is maintained lower than that of the initial vapor duct 55. In the main vapor duct 56 of a lower pressure, a flow rate can be precisely adjusted by the needle valve 66.

Connected to a downstream side of the main vapor duct 56 via a switching valve 70 is a vapor supply duct (process-fluid supply duct) 171 that introduces a vapor into the processing vessel 30 so as to supply the vapor to a processing space 83 in the processing vessel 30. In addition, connected to the downstream side of the main vapor duct 56 via the switching valve 70 is a vapor bypass duct 172 that guides the process fluid, which is not introduced into the vapor supply duct 171, so as to bypass the processing space 83 but to pass through the processing vessel 30.

The vapor supply duct 171 has a process-side vapor duct 71, and a below-described temperature adjusting duct 97 connected to a downstream end of the process-side vapor duct 71 via the switching valve 70. The vapor bypass duct 172 has a bypass-side vapor duct 72, a below-described temperature adjusting duct 95 connected to a lower end of the bypass-side vapor duct 72 via the switching valve 70, and a below-described second bypass-side vapor duct 72' connected to a lower end of the temperature adjusting duct 95.

The switching valve 70 is formed a three-way valve. The switching valve 70 can select a condition in which a vapor generated by the vapor generating part 41 is supplied to the processing space 83 in the processing vessel 30 of the processing unit 23a through the vapor supply duct 171, and a condition in which a vapor generated by the vapor generating part 41 is guided through the vapor bypass duct 172 to bypasses processing space 83 without being supplied to the processing space 83.

Figure 4:
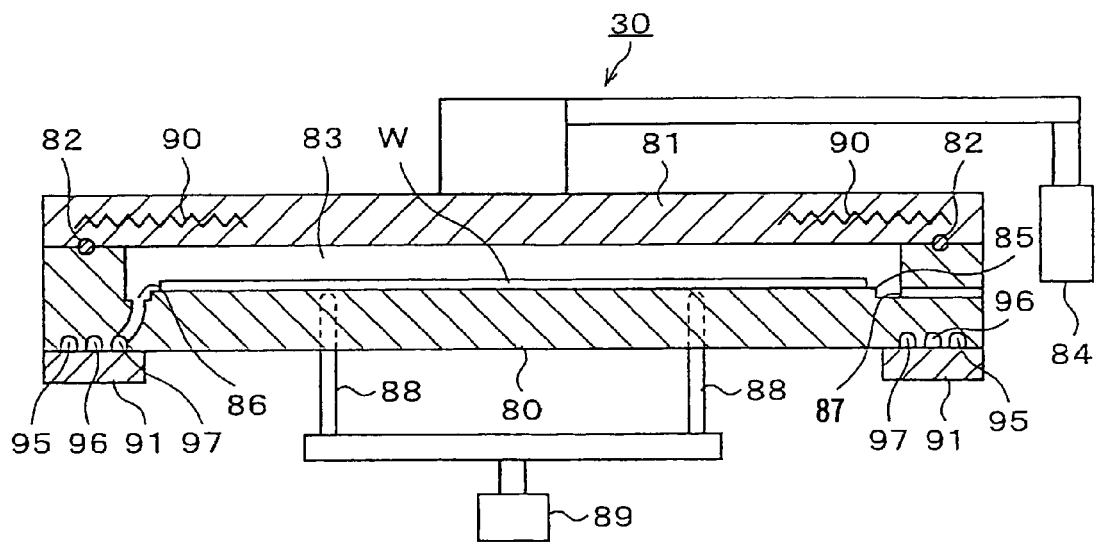
FIG. 4 is a longitudinal sectional view showing a schematic structure of a processing vessel.
Figure 5:
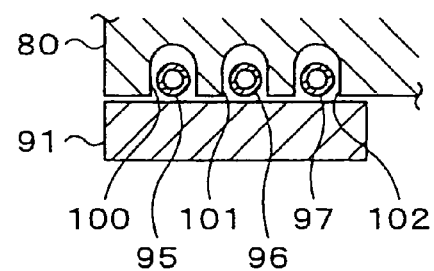
FIG. 5 is a partially enlarged sectional view of a bottom surface of the processing vessel.
Figure 6:
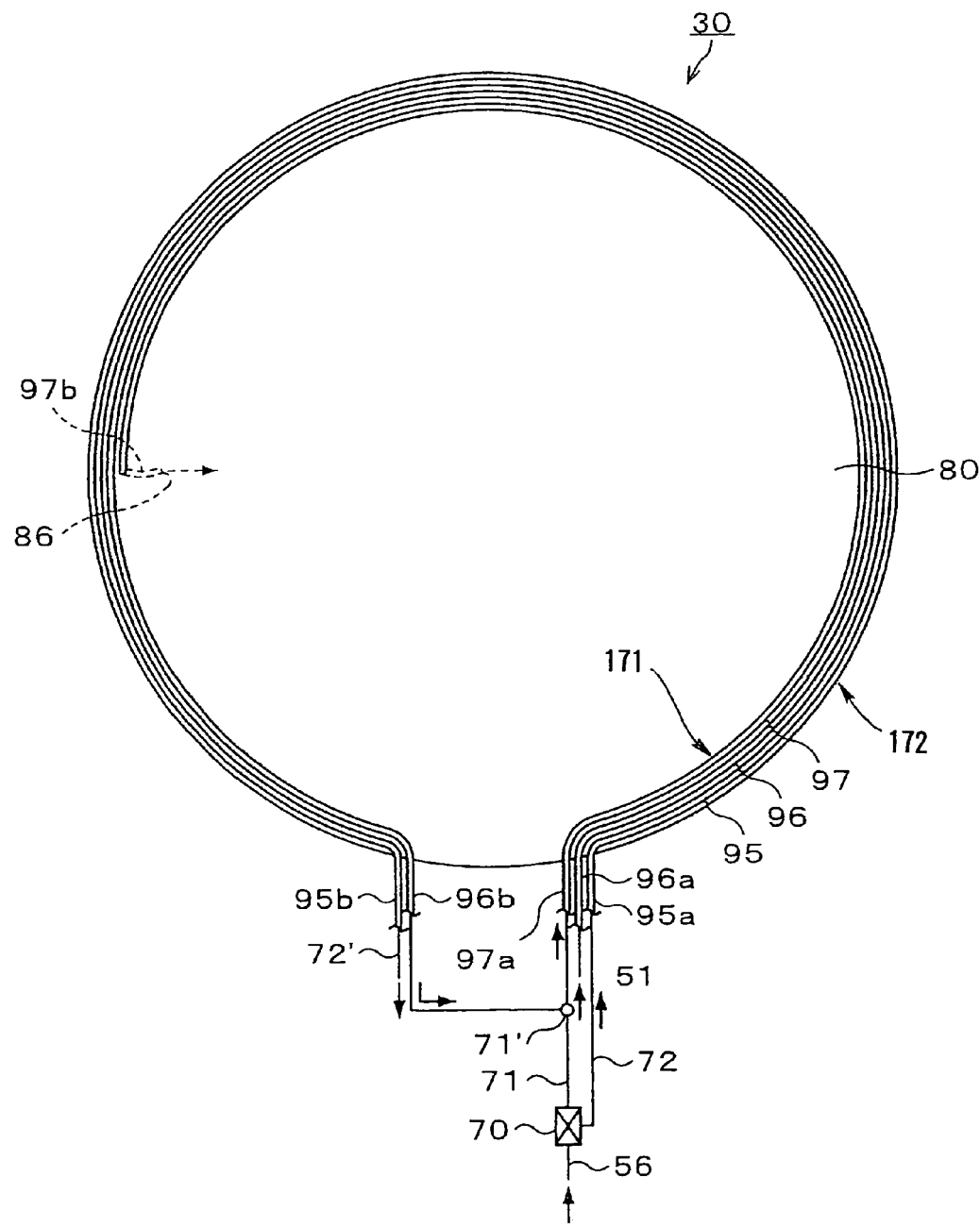
FIG. 6 is a bottom view of the processing vessel from which a heater is removed.

FIG. 4 is a longitudinal sectional view showing a schematic embodiment of the processing vessel 30. FIG. 5 is a partially enlarged sectional view of a bottom surface of the processing vessel 30 (vessel body 80). FIG. 9 is a bottom view of the processing vessel 30 (vessel body 80) from which a heater 91 is removed.

The processing vessel 30 is composed of the hollow cylindrical vessel body 80 with an upper surface thereof being opened and a bottom surface thereof being closed, and a discoid lid member 81 capable of hermetically sealing the upper opening of the vessel body 80. Both the vessel body 80 and the lid member 81 are formed of a material of an excellent heat conductivity such as aluminum. An O-ring 82 as a sealing member is located on an upper surface of a sidewall part of the vessel body 80. As shown in FIG. 4, when the lid member 81 is brought into tight contact with the upper surface of the vessel body 80, a lower surface of a peripheral portion of the lid member 81 is brought into tight contact with the O-ring 82. Thus, the hermetically sealed processing space 83 is formed inside the processing vessel 30. Disposed on an upper surface of the lid member 81 is a cylinder apparatus 84 that lifts and lowers the lid member 81 with respect to the vessel body 80. By activating the cylinder apparatus 84 to bring the lid member 81 into tight contact with the upper surface of the vessel body 80, the inside of the processing vessel 30 can be hermetically sealed. When a wafer W is loaded into or unloaded from the processing vessel 30, the processing space 83 can be opened by lifting the lid member 81 by activating the cylinder apparatus 84 so as to separate the lid member 81 from the upper surface of the vessel body 80.

Located on an upper part of a bottom surface of the vessel body 80 is a stage 85 for placing thereon a wafer W accommodated in the processing vessel 30. Formed on opposite sides of the stage 85 are an inlet port 86 through which an ozone gas and a vapor as process fluids are supplied into the processing vessel 30, and an outlet port 87 through which an ozone gas and a vapor as process fluids are discharged from the processing vessel 30. As described below, it is possible to supply and discharge an $N_2$ gas as a purge gas into and from the processing vessel 30 through the inlet port 86 and the outlet port 87. Provided in the stage 85 are lifting pins 88 for lifting and lowering a wafer W placed on the stage 85. The lifting pins 88 are configured to be lifted and lowered by activating a cylinder apparatus 89 disposed below the vessel body 80.

A ring-shaped heater 90 is incorporated in the lid member 81. A ring-shaped heater 91 is disposed on a lower part of the bottom surface of the vessel body 80. Due to the heating operation of the heaters 90 and 91, a temperature of the overall processing vessel 30 is adjusted, and the processing space 83 is maintained at a desired process temperature.

The three temperature adjusting duct 95, 96, and 97 are arranged in a peripheral portion of the bottom surface of the vessel body 80. The outermost temperature adjusting duct 95 and the second outermost temperature adjusting duct 96 are arranged such that the ducts 95 and 96 substantially make a full round of the peripheral portion of the bottom surface of the vessel body 80, while thermally contacting the bottom surface of the vessel body 80. On the other hand, the innermost temperature adjusting duct 97 is arranged such that the duct 97 makes an about three fourths of the full round of the peripheral portion of the bottom surface of the vessel body 80, while thermally contacting the bottom surface of the vessel body 80. The three temperature adjusting ducts 95, 96, and 97 are not limited to the above examples. As described below, as long as the three temperature adjusting ducts 95, 96, and 97 can properly adjust temperatures of an ozone gas, a vapor, and $N_2$ passing therethrough, any lengths will do. An entrance portion 95a and an exit portion 95b of the outermost temperature adjusting duct 95, and an entrance portion 96a and an exit portion 96b of the second outermost temperature adjusting duct 96 are positioned outside the processing vessel 30 (vessel body 80). Meanwhile, an entrance portion 97a of the innermost temperature adjusting duct 97 is positioned outside the processing vessel 30 (vessel body 80), and an exit portion 97b of the temperature adjusting duct 97 is communicated with the inlet port 86 opened into the processing vessel 30 (processing space 83).

As shown by the enlarged view of FIG. 5, three grooves 100, 101, and 102 are formed in the peripheral portion of the bottom surface of the vessel body 80. The above temperature adjusting ducts 95, 96, and 97 are structured by fitting, for example, PFA tubes (PFA: tetrafluoro ethylene perfuloro alkoxy vinyl ether copolymer resin) in the three grooves 100, 101, and 102.

The ring-shaped heater 91 is configured to be brought into tight contact with the peripheral portion of the bottom surface of the vessel body 80 from below, so as to cover the whole grooves 101, 102, and 103 in which the temperature adjusting ducts 95, 96, and 97 are accommodated. Thus, the heat of the heater 91 can be surely transmitted to the temperature adjusting ducts 95, 96, and 97, and the vessel body 80.

A downstream side of the aforementioned process-side ozone-gas duct 51 is connected to the entrance portion 96a of the temperature adjusting duct 96. The exit portion 96b of the temperature adjusting duct 96 is connected to a merging point 71' between the temperature adjusting duct 96 and the aforementioned process-side vapor duct 71. A downstream side of the aforementioned process-side vapor duct 71 is connected to the entrance portion 97a of the temperature adjusting duct 97 at a position further downstream the merging point 71'.

Thus, an ozone gas flowing through the process-side ozone-gas duct 51 can be heated to a desired temperature by a heat of the heater 91, when the ozone gas passes through the temperature adjusting duct 96. Then, the ozone gas, which has been heated to the desired temperature during the passage thereof through the temperature adjusting duct 96, is mixed to a vapor flowing through the process-side vapor duct 71 at the merging point 71'. Then, a temperature of the mixed gas of the ozone gas and the vapor is adjusted again to the desired temperature by the heat of the heater 91, when the mixed gas passes through the temperature adjusting duct 97. Thereafter, the mixed gas of the ozone gas and the vapor, which has been adjusted again to the desired temperature, is supplied into the processing vessel 30 through the inlet port 86.

The aforementioned bypass-side vapor duct 72 is connected to the entrance portion 95a of the temperature adjusting duct 95. The exit portion 95b of the temperature adjusting duct 95 is connected to the second bypass-side vapor duct 72'. A downstream side of the second bypass-side vapor duct 72' is connected to the main discharge duct 105, which is described below, through a vapor flowback preventing orifice 73 that prevents a flowback of the vapor.

As shown in FIG. 3, the main discharge duct 105 is connected to the outlet port 87 through which an ozone gas and a vapor as process fluids are discharged from the processing vessel 30. The main discharge duct 105 is provided with a switching valve 106, a pressure switch 107, a flowback preventing orifice 108, an air-operated valve 109, and a relief valve 110 in this order. A downstream side of the aforementioned bypass-side ozone-gas duct 52 and a downstream side of the aforementioned second bypass-side vapor duct 72' are connected to the main discharge duct 105 at positions between the flowback preventing orifice 108 and the air-operated valve 109.

Further, in this embodiment, an $N_2$-gas supply duct 115 is connected to the process-side ozone-gas duct 51. The $N_2$-gas supply duct 115 is branched from an initial $N_2$-gas duct 116 that supplies an $N_2$ gas from an $N_2$ supply source outside the processing system 1. The $N_2$-gas supply duct 115 is provided with an air-operated valve 117 for controlling the supply of an $N_2$ gas.

An $N_2$-gas discharge duct 118 is connected to the switching valve 106 disposed on the main discharge duct 105. The switching valve 106 is a three-way valve, and can select a condition, as described below, in which an ozone gas and a vapor as process fluids, which have been discharged from the processing vessel 30 through the outlet port 87, is discharged through the main discharge duct 105, and a condition, as described below, in which an $N_2$ gas as a purge gas, which has been discharged from the processing vessel 30 through the outlet port 87, is discharged through the $N_2$-gas discharge duct 118.

Although the description is made taking the processing unit 23a as a typical example, the other processing units 23b to 23f have the same structure.

Functional elements of the processing system 1 are connected through signal lines to the control computer 19 that automatically controls an operation of the overall processing system 1. Herein, the functional elements means all the elements that are operated to realize predetermined process conditions, such as the wafer transfer apparatus 7 and the window opening/closing mechanism 10 disposed in the loading/unloading part 3, the main wafer transfer apparatus 18, the four cleaning units 12, 13, 14, and 15, the ozone-gas generating part 40 and the vapor generating part 41 provided in the process-gas generating unit 24, and the chemical-liquid storage unit 5, the switching valves 50, 70, and 106, the heaters 90 and 91 in the respective processing units 23a to 23f, which are disposed in the processing part 2. The control computer 19 is typically a multi-purpose computer capable of achieving a given function depending on a software to be executed.

As shown in FIG. 1, the control computer 19 includes a computing part 19a having a CPU (central processing unit), an input/output part 19b connected to the computing part 19a, and a storage medium 19c storing a control software, the storage medium 19c being inserted in the input/output part 19b. The storage medium 19c stores a control software (program) executable by the control computer 19 to thereby cause the processing system 1 to perform a below-described substrate processing method. By executing the control software, the control computer 19 controls the respective functional elements of the processing system 1 such that various process conditions (e.g., temperature of the processing vessel 30) defined by a predetermined process recipe are realized.

The storage medium 19c may be built in the control computer 19. Alternatively, the storage medium 19c may be removably fixed on a reader, not shown, mounted on the control computer 19, and may be readable by the reader. In the most typical case, the storage medium 19c is a hard disk drive in which the control software is installed by an operator of a manufacturing company of the processing system 1. In another embodiment, the storage medium 19c is a removable disk such as a CD-ROM or a DVD-ROM in which the control software is written. Such a removable disk is read by an optical reader, not shown, disposed on the control computer 19. The storage medium 19c may either be of a RAM (random access memory) type or a ROM (read only memory) type. Alternatively, storage medium 19c may be a cassette type ROM. In short, any medium known in the technical field of a computer can be employed as the storage medium 19c. In addition, in a factory in which the plurality of processing systems 1 are established, the control software may be stored in an administrative computer that collectively controls the control computers 19 of the respective processing systems 1. In this case, each of the processing systems 1 is operated by the administrative computer through a communication line so as to perform predetermined processes.

Next, a processing step of a wafer W performed by the processing system 1 as structured above is described. At first, wafers W are drawn out one by one by the drawing and receiving arm 11 from the carrier C placed on the stage 6 of the in/out port 4. The wafers W drawn out by the drawing and receiving arm 11 are transferred to the lower wafer delivery unit 17. Then, the main wafer transfer apparatus 18 receives the wafers W from the wafer delivery unit 17, and the wafer W are suitably loaded into the respective processing units 23a to 23f by the main wafer transfer apparatus 18. In the processing units 23a to 23f, a resist applied to surfaces of the wafers W are water-solubilized. After the wafers W have been subjected to the predetermined process for water-solubilizing a resist, the wafers W are suitably unloaded from the respective processing units 23a to 23f by the transfer arm 18a. Thereafter, the wafers W are suitably loaded by the transfer arm 18a into the respective cleaning units 12, 13, 14, and 15 where a cleaning process for removing the water-solubilized resist adhering to the wafer W is performed by means of a deionized water. Thus, the resist applied to the wafers W can be peeled. After the performance of the cleaning process to the wafers W, the respective cleaning units 12, 13, 14, and 15 perform a process for removing particles and metal by means of a chemical liquid, according to need, and then perform a drying process. Subsequently, the wafers W are transferred to the upper delivery unit 16 again by the transfer arm 18a. Then, the wafers W are received by the drawing and receiving arm 11 from the delivery unit 16. After that, the wafers W from which the resist has been removed are sent into the carrier C by the drawing and receiving arm 11, and are accommodated in the carrier C.

Next, an operation of the processing units 23a to 23f is described, taking the processing unit 23a as a typical example. Firstly, in the processing vessel 30, the lid member 81 is lifted by activating the cylinder apparatus 84 so as to separate the lid member 81 from the upper surface of the vessel body 80, whereby the processing space 83 is opened. Under this state, a wafer W is loaded thereinto by the transfer arm 18a of the main wafer transfer apparatus 18, and the wafer W is placed on the stage 85. In order to place the wafer W on the stage 85, the wafer W is received by the lifting pins 88 provided inside the stage 85 which have been lifted by activating the cylinder apparatus 89, and then the lifting pins 88 are lowered so that the wafer W is placed on the stage 85. Then, after the transfer arm 18a is withdrawn, the lid member 81 is lowered to thereby form the processing space 83 that is hermetically sealed.

After the wafer W has been loaded in the manner as described above, there is firstly performed a temperature elevating step in which temperatures of the processing vessel 30 and the wafer W are elevated. Namely, in the temperature elevating step, the temperatures of the processing vessel 30 and the wafer W are elevated by activating the heaters 90 and 91. In addition, the switching valve 50 is selected such that an ozone gas that has been generated by the ozone-gas generating part 40 is supplied into the processing vessel 30 of the processing unit 23a from the process-side ozone-gas duct 51 through the temperature adjusting ducts 96 and 97. On the other hand, a vapor that has been generated by the vapor generating part 41 is passed through the bypass-side vapor duct 72 by the switching valve 70, and is discharged to the main discharge duct 105 through the temperature adjusting duct 95 and the second bypass-side vapor duct 72'. In the temperature elevating step, the air-operated valve 117 disposed in the $N_2$-gas supply duct 115 is closed so as to stop a supply of an $N_2$ gas. In addition, the switching valve 106 disposed in the main discharge duct 105 is switched such that the ozone gas that has been discharged from the processing vessel 30 through the outlet port 87 is discharged through the main discharge duct 105.

From the ozone-gas generating part 40, the ozone gas, which has been generated by discharging electricity in a gas containing oxygen, is supplied at a set pressure of, e.g., 100 to 300 kPa. A flow rate of the ozone gas is set at, e.g., 2 to 5 liters per minute by the needle valve 47 disposed in the main ozone duct 46.

On the other hand, from the vapor generating part 41, the vapor, which has been generated by boiling a deionized water, is supplied at a set pressure of, e.g., 80 to 95 kPa. A flow rate of the vapor is set at, e.g., 2 to 5 grams per minute by the needle valve 66 disposed in the main vapor duct 56.

In this manner, in the temperature elevating step, the processing vessel 30 and the wafer W are heated to a predetermined temperature, while an inner atmosphere of the processing vessel 83 is replaced with an ozone atmosphere. In this case, the predetermined temperature to which the processing vessel 30 and the wafer W are heated is, for example, 100 to 110° C. In the temperature elevating step, the ozone gas is supplied into the processing space 83 from the process-side ozone-gas duct 51 through the temperature adjusting duct 96 and the temperature adjusting duct 97 in the bottom surface of the vessel body 80. It follows that there is supplied into the processing space 83 the ozone gas whose temperature has been elevated when the ozone gas pass through the temperature adjusting duct 96 and the temperature adjusting duct 97.

In the temperature elevating step, since the vapor of a high temperature, which has been generated by the vapor generating part 41, passes through the orifice 65 and the needle valve 66, the orifice 65 and the needle 66 can be maintained at a predetermined temperature.

In the temperature elevating step, the ozone gas, which has been discharged from the processing vessel 30 through the outlet port 87, is discharged through the main discharge duct 105. Further, the vapor that has been passed through the bypass-side vapor duct 72 is discharged to the main discharge duct 105 through the temperature adjusting duct 95 and the second bypass-side vapor duct 72'. Thus, a mixed gas of the ozone gas and the vapor is discharged outside from the main discharge duct 105 through the air-operated valve 109 and the relief valve 110. A set pressure of the relief valve 110 disposed in the main discharge duct 105 is set at, e.g., 50 to 75 kPa.

In the temperature elevating step, since the ozone gas having passed through the processing space 83 and the vapor having passed through the temperature adjusting duct 95 pass the relief valve 110 disposed in the main discharge duct 105, the relief valve 110 can be also maintained at a predetermined temperature.

After the processing vessel 30 and the wafer W are heated up to a predetermined temperature (e.g., 100 to 110° C.), and the orifice 65 and the needle valve 66 disposed in the main vapor duct 56 and the relief valve 110 disposed in the main discharge duct 105 are maintained at a predetermined temperature, the temperature elevating step is finished.

Following thereto, there is performed a step for processing the wafer W accommodated in the processing vessel 30. Namely, the switching valve 70 is selected such that a vapor that has been generated in the vapor generating part 41 is supplied into the processing space 83 in the processing vessel 30 of the processing unit 23a through the vapor supply duct 171.

At this time, the orifice 65 and the needle valve 66 disposed in the main vapor duct 56 has been already stabilized at a predetermined temperature in the above temperature elevating step. Thus, a flow rate of the vapor is precisely adjusted by the orifice 65 and the needle valve 66. Thus, in the processing step, an amount of the vapor to be supplied into the processing space 83 in the processing vessel 30 through the vapor supply duct 171 can be made constant.

In addition, in the processing step, an ozone gas coming from the process-side ozone-gas duct 51 through the temperature adjusting duct 96 is mixed to a vapor flowing through the process-side vapor duct 71, with a temperature of the vapor having been elevated to a high temperature such as about 110° C. Thus, when the ozone gas is mixed to the vapor at the merging point 71', cooling of the vapor flowing through the process-side vapor duct 71 can be avoided, whereby a condensation of the vapor can be prevented.

The mixed gas of the ozone gas and the vapor, which have been mixed in the process-side vapor duct 71, further passes through the temperature adjusting duct 97 so as to be supplied into the processing vessel 30 through the inlet port 86. At this time, during the passage of the mixed gas of the ozone gas and the vapor through the temperature adjusting duct 97, a temperature of the mixed gas is adjusted to a predetermined temperature which is the same as that of the processing vessel 30. Thus, the mixed gas of the ozone gas and the vapor can be constantly supplied at a stable temperature into the processing vessel 30, without condensation of the vapor.

Namely, in the processing step, the mixed gas of the ozone gas and the vapor is supplied at a constant process temperature to the wafer W inside the processing vessel 30 which has been elevated to a predetermined temperature. Thus, the process for oxidizing and water-solubilizing a resist applied to the surface of the wafer W can be effectively performed.

In addition, in the processing step, the mixed gas of the ozone gas and the vapor, which has been discharged from the processing vessel 30 through the outlet port 87, is discharged through the main discharge duct 105. At this time, the relief valve 110 disposed in the main discharge duct 105 has been already stabilized at a predetermined temperature in the above temperature elevating step. Thus, a flow rate of the mixed gas can be precisely adjusted by the relief valve 110, whereby the process of the wafer W in the processing vessel 30 can be more stably performed.

After the completion of the predetermined process for water-solubilizing a resist, there is performed a purge step in which the inner atmosphere of the processing vessel 30 is replaced with an $N_2$ gas atmosphere. Namely, the switching valve 50 is selected such that an ozone gas that has been generated by the ozone-gas generating part 40 is passed through the bypass-side ozone-gas duct 52, without being supplied to the processing vessel 30. In addition, the switching valve 70 is selected such that a vapor that has been generated by the vapor generating part 41 is passed through the bypass-side vapor duct 72, without being supplied to the processing vessel 30.

In the purge step, by opening the air-operated valve 117 disposed in the $N_2$-gas supply duct 115, an $N_2$ gas is supplied to the processing vessel 30 through the process-side ozone-gas duct 51. In addition, the switching valve 106 is selected such that the $N_2$ gas, which has been discharged from the processing vessel 30 through the outlet port 87, is discharge through the $N_2$-gas discharge duct 118. Thus, in the purge step, by supplying an $N_2$ gas into the processing vessel 30, the inner atmosphere of the processing vessel 30 is replaced with an $N_2$ gas atmosphere.

In the purge step, the $N_2$ gas that has purged the inner atmosphere of the processing vessel 30 is not discharged to the main discharge duct 105, but is discharged through the $N_2$-gas discharge duct 118. Meanwhile, the vapor of a high temperature, which has been generated by the vapor generating part 41, continuously passes the orifice 65 and the needle valve 66 disposed in the main vapor duct 56, so that the elevated temperatures of the orifice 65 and the needle valve 66 are maintained. Further, the vapor, which has been passed through the bypass-side vapor duct 72, is discharged to the main discharge duct 105 through the temperature adjusting duct 95 and the second bypass-side vapor duct 72'. Thus, it is also possible to maintain the elevated temperature of the relief valve 110 disposed in the main discharge duct 105 to thereby realize the stable control.

In the purge step, there is supplied into the processing vessel 30 an $N_2$ gas whose temperature has been elevated through the temperature adjusting duct 96 and the temperature adjusting duct 97. Thus, the elevated temperature of the processing vessel 30 is also maintained.

In this manner, the inner atmosphere of the processing vessel 30 is replaced with an $N_2$ gas atmosphere by the purge step. Thereafter, in the processing vessel 30, the lid member 81 is lifted by activating the cylinder apparatus 84 so as to separate the lid member 81 from the upper surface of the vessel body 80, whereby the processing space 83 is opened. Under this state, the lifting pins 88 are lifted by activating the cylinder apparatus 89, so that the wafer W is raised from the stage 85. Then, the transfer arm 18a of the main wafer transfer apparatus 18 comes below the wafer W to receive the wafer W, and unloads the wafer W from the processing vessel 30.

Although the process in the processing unit 23a is described as a typical example, the same process is performed in each of the processing units 23b to 23f.

In the processing system 1, both in the processing step in which a vapor is supplied to the processing vessel 30, and in the purge step in which a vapor is caused to bypass the processing vessel 30 so as to pass through the bypass-side vapor duct 72, a vapor is constantly supplied to the orifice 65 and the needle valve 66 disposed in the main vapor duct 56. Thus, the temperatures of the orifice 65 and the needle valve 66 can be invariably made constant, and thus an opening degree of the valve is unchanged. Accordingly, a flow rate of the vapor to be supplied can be precisely adjusted. As a result, it is possible to perform a stable process to a wafer W. In addition, the relief valve 110 disposed in the main discharge duct 105 can be also constantly maintained under the elevated temperature condition. Namely, in addition to the orifice 65 and the needle valve 66 disposed in the main vapor duct 56, a precise flow-rate adjustment can be also achieved by the relief valve 110 disposed in the main discharge duct 105. Thus, a process to a wafer W can be more stabilized. Consequently, it is also possible to stably perform the process for water-solubilizing a resist to a wafer W. Accordingly, a resist-peeling uniformity and reliability in the subsequent cleaning process performed by the respective cleaning units 12, 13, 14, and 15 can be improved, resulting in improvement in an overall etching-process uniformity and reliability including the process in the processing system 1.

One example of the preferred embodiment of the present invention has been described above, but the present invention is not limited to the above embodiment. For example, in addition to an ozone gas and a vapor, a process fluid used in the present invention may be another process gas. Thus, the present invention can be widely applied to processes using various process fluids. Moreover, an object to be processed is not limited to a semiconductor wafer, but may be a glass for an LCD substrate, a CD substrate, a print substrate, a ceramic substrate, and so on.

The present invention may be applied to a cleaning process of, e.g., a semiconductor wafer, a glass for an LCD substrate, and so on.

The invention claimed is:

1. A processing system comprising:
a processing vessel including a heater, and configured to accommodate an object to be processed in a processing space;
a process-fluid generating part configured to generate a process fluid of a predetermined temperature;
a main duct connected to the process-fluid generating part, the main duct being configured to guide the process fluid supplied from the process-fluid generating part;
a process-fluid supply duct arranged on a downstream side of the main duct via a switching valve, the process-fluid supply duct being configured to introduce the process fluid into the processing vessel so as to supply the process fluid to the processing space in the processing vessel;
a process-fluid bypass duct arranged on the downstream side of the main duct via the switching valve, the process-fluid bypass duct being configured to guide a process fluid, which is not introduced to the process-fluid supply duct, so as to bypass the processing space; and
a discharge duct configured to discharge process fluid from the processing space in the processing vessel and process fluid guided by the process-fluid bypass duct, wherein
the main duct includes a flow-rate adjusting mechanism for adjusting a flow rate of the process fluid flowing through the main duct,
the discharge duct is provided with a flow-rate adjusting valve for adjusting a flow rate of the process fluid flowing through the discharge duct,
a joining point of the process-fluid bypass duct to the discharge duct is located on the upstream side of the flow-rate adjusting valve, and
the process-fluid bypass duct passes through the processing vessel so that the process fluid in the process-fluid bypass duct is heated by the heater.

2. The processing system according to claim 1, wherein the process-fluid bypass duct is provided with a temperature adjusting duct for adjusting a temperature of the process fluid flowing through the process-fluid bypass duct.

3. The processing system according to claim 2, wherein the temperature adjusting duct is thermally in contact with the processing vessel.

4. The processing system according to claim 1, wherein the process fluid is a vapor.

5. A processing system comprising:
a processing vessel including a heater, and configured to accommodate an object to be processed in a processing space;
a process-fluid generating part configured to generate a process fluid of a predetermined temperature;
a main duct connected to the process-fluid generating part, the main duct being configured to guide the process fluid supplied from the process-fluid generating part;
a process-fluid supply duct arranged on a downstream side of the main duct via a switching valve, the process-fluid supply duct being configured to introduce the process fluid into the processing vessel so as to supply the process fluid to the processing space in the processing vessel;
a process-fluid bypass duct arranged on the downstream side of the main duct via the switching valve, the process-fluid bypass duct being configured to guide a process fluid, which is not introduced to the process-fluid supply duct, so as to bypass the processing space; and
a discharge duct configured to discharge process fluid from the processing space in the processing vessel and process fluid guided by the process-fluid bypass duct, wherein
the main duct includes a flow-rate adjusting mechanism for adjusting a flow rate of the process fluid flowing through the main duct,
the discharge duct is provided with a flow-rate adjusting mechanism for adjusting a flow rate of the process fluid flowing through the discharge duct,
a joining point of the process-fluid bypass duct to the discharge duct is located on the upstream side of the flow-rate adjusting mechanism, and
the process-fluid bypass duct passes through the processing vessel, proximal to the heater, so that the process fluid in the process-fluid bypass duct is heated by the heater.

6. A processing system comprising:
a processing vessel including a heater, and configured to accommodate an object to be processed in a processing space;
a process-fluid generating part configured to generate a process fluid of a predetermined temperature;
a main duct connected to the process-fluid generating part, the main duct being configured to guide the process fluid supplied from the process-fluid generating part;
a process-fluid supply duct arranged on a downstream side of the main duct via a switching valve, the process-fluid supply duct being configured to introduce the process fluid into the processing vessel so as to supply the process fluid to the processing space in the processing vessel;
a process-fluid bypass duct arranged on the downstream side of the main duct via the switching valve, the process-fluid bypass duct being configured to guide a process fluid, which is not introduced to the process-fluid supply duct, so as to bypass the processing space; and
a discharge duct configured to discharge process fluid from the processing space in the processing vessel and process fluid guided by the process-fluid bypass duct, wherein
the main duct includes a flow-rate adjusting mechanism for adjusting a flow rate of the process fluid flowing through the main duct,
the discharge duct is provided with a flow-rate adjusting valve for adjusting a flow rate of the process fluid flowing through the discharge duct,
a joining point of the process-fluid bypass duct to the discharge duct is located on the upstream side of the flow-rate adjusting valve, and
the process-fluid bypass duct passes through the processing vessel, proximal to the heater, so that the process fluid in the process-fluid bypass duct is heated by the heater.

* * * * *